(12) United States Patent
Poon

(10) Patent No.: US 9,524,813 B2
(45) Date of Patent: Dec. 20, 2016

(54) TRANSPARENT CONDUCTIVE ELECTRODES COMPRISING SURFACE FUNCTIONALIZED METAL NANOWIRES, THEIR STRUCTURE DESIGN, AND METHOD OF MAKING SUCH STRUCTURES

(71) Applicant: Nuovo Film, Inc., Jiangsu (CN)

(72) Inventor: Hakfei Poon, Mountain View, CA (US)

(73) Assignee: Nuovo Film, Inc., Suzhou (Jiangsu) (CN)

( * ) Notice: Subject to any disclaimer, the term of this patent is extended or adjusted under 35 U.S.C. 154(b) by 35 days.

(21) Appl. No.: 14/360,904

(22) PCT Filed: Apr. 3, 2014

(86) PCT No.: PCT/CN2014/074717
§ 371 (c)(1),
(2) Date: May 27, 2014

(87) PCT Pub. No.: WO2014/161499
PCT Pub. Date: Oct. 9, 2014

(65) Prior Publication Data
US 2015/0008016 A1   Jan. 8, 2015

Related U.S. Application Data

(60) Provisional application No. 61/809,224, filed on Apr. 5, 2013, provisional application No. 61/809,353, filed (Continued)

(51) Int. Cl.
*B32B 3/00* (2006.01)
*H01B 13/30* (2006.01)
*H05K 1/02* (2006.01)
*H05K 1/03* (2006.01)
*H05K 1/09* (2006.01)
(Continued)

(52) U.S. Cl.
CPC ............... *H01B 13/30* (2013.01); *G06F 3/041* (2013.01); *H01B 1/02* (2013.01); *H01B 1/22* (2013.01); *H01L 31/022466* (2013.01); *H01L 31/1884* (2013.01); *H05K 1/0274* (2013.01); *H05K 1/0298* (2013.01); *H05K 1/03* (2013.01); *H05K 1/09* (2013.01); *G06F 2203/04103* (2013.01);
(Continued)

(58) Field of Classification Search
CPC ............ H05K 1/09; H05K 3/06; H05K 3/027; H05K 3/1283; H05K 2201/026; Y10T 428/2913; Y10T 428/24802; Y10T 428/24909
See application file for complete search history.

(56) References Cited

U.S. PATENT DOCUMENTS 8,018,568 B2   9/2011   Allemand et al.
8,049,333 B2   11/2011   Alden et al.
(Continued)

*Primary Examiner* — Elizabeth Mulvaney
(74) *Attorney, Agent, or Firm* — Abelman, Frayne & Schwab

(57) ABSTRACT

Discloses herein is a patterned transparent conductive electrode, comprises a substrate and a substantial single conductive layer on top of the substrate. The single conductive layer comprises a first region comprising a network of silver nanowires and means for protecting the nanowire from surface oxidation; and a second region, comprising a plurality of metal nanowires and means for protecting nanowire from surface oxidation, and metal oxide nanowires.

11 Claims, 14 Drawing Sheets

Related U.S. Application Data on Apr. 6, 2013, provisional application No. 61/809,354, filed on Apr. 6, 2013.

(51) Int. Cl.
    *G06F 3/041*     (2006.01)
    *H01B 1/02*     (2006.01)
    *H01B 1/22*     (2006.01)
    *H01L 31/0224*     (2006.01)
    *H01L 31/18*     (2006.01)

(52) U.S. Cl.
    CPC ........... *G06F 2203/04112* (2013.01); *H05K 2201/032* (2013.01); *H05K 2201/0302* (2013.01)

(56) References Cited

U.S. PATENT DOCUMENTS

| | | | | |
|---|---|---|---|---|
| 2008/0143906 A1* | 6/2008 | Allemand | ............ | B82Y 10/00 349/43 |
| 2009/0188697 A1* | 7/2009 | Guiheen | ............ | H01B 1/02 174/126.4 |
| 2009/0321113 A1* | 12/2009 | Allemand | ............ | B22F 1/0022 174/257 |
| 2011/0253668 A1* | 10/2011 | Winoto | ............ | B82Y 10/00 216/13 |

* cited by examiner

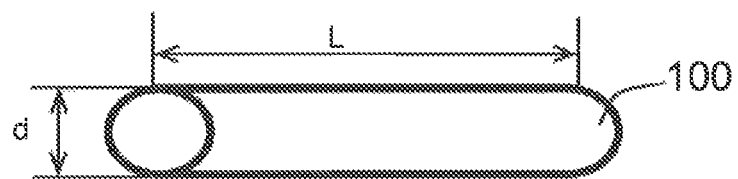
FIG. 1
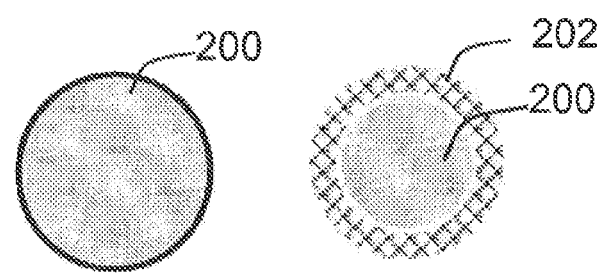
FIG. 2a    FIG. 2b
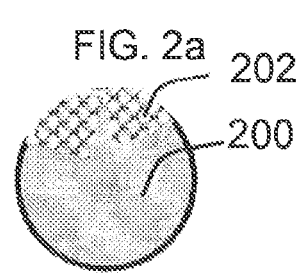    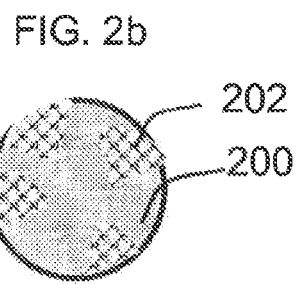
FIG. 2c    FIG. 2d
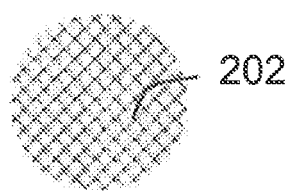
FIG. 2e

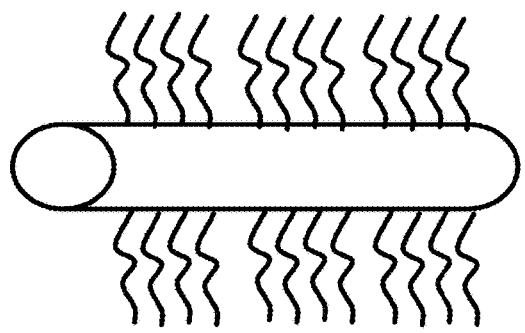
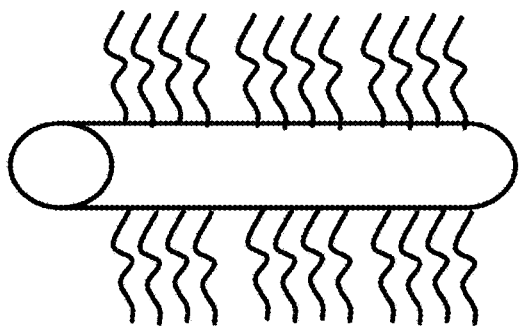
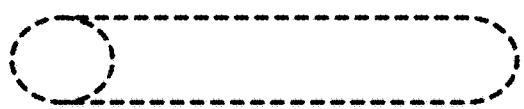
FIG. 8a          FIG. 8b specially engineered nanowires disintegrate (magnified view)

TRANSPARENT CONDUCTIVE ELECTRODES COMPRISING SURFACE FUNCTIONALIZED METAL NANOWIRES, THEIR STRUCTURE DESIGN, AND METHOD OF MAKING SUCH STRUCTURES

CROSS-REFERENCE TO RELATED APPLICATIONS

This application claims the benefit of PCT application PCT/CN2014/074717, filed on April 3, 2014, which in turn takes priority of U.S. Provisional Patent Applications 61/809,224, 61/809,353, and 61/809,354. The subject matter as set forth in the PCT application, in each one of the following US utility patent applications and Chinese patent application are incorporated herein by reference in its entirety:

Ser. No. 61/809,224, filed April 5, 2013;
Ser. No. 61/809,353, filed April 6, 2013; and
Ser. No. 61/809,354, filed April 6, 2013;

TECHNICAL FIELD OF THE DISCLOSURE

This present patent application relates, in general, to the art of transparent electrodes, including their structures and method of making, and more particularly, to the art of fabricating transparent electrodes having surface functionalized metal nanowires.

BACKGROUND OF THE DISCLOSURE

Indium tin-oxide (ITO) is traditionally widely used as a transparent conductor in transparent electrodes in science and research community, but it also has well drawbacks in large scale manufacturing processes. First, in order to make electrodes, ITO is vacuum deposited onto substrates, and the vacuum deposition process is expensive and low throughput. Second, in most of applications, 150 nm or thicker of ITO is needed to ensure electrical performance, but at such thicknesses, ITO films become brittle making them not feasible for applications requiring large areas or flexible substrates. Third, to achieve good conductivity and clarity, ITO films need to be annealed at high temperatures, preferably over 200 C, thus limiting its application on high temperature resistant substrates such as glass. Due to the low softening point of polymers, most polymer based ITO films cannot withstand the annealing temperatures required for achieving the high conductivity and transparency at the same time. Therefore as electro-optical applications expand to more novel and exotic functionalities, such as 3-dimensional displays and solar cells, there is an increasing demand to invent alternative transparent electrodes with better than or comparable optical and electrical performance of ITO but suitable for large area flexible substrate and can be manufactured in an inexpensive high through manner.

Transparent conductive electrodes comprising printable metal nanowires have been successfully demonstrated as alternatives to be manufactured at low cost and on a large scale and with excellent performance including conductivity and transparency.

However, most of the commercial available transparent electrode having metal nanowires embedded in a matrix. "Matrix" refers to a solid-state material into which the metal nanowires are dispersed or embedded. The matrix is a host for the metal nanowires and provides a physical form of the conductive layer. The matrix protects the metal nanowires from adverse environmental factors, such as corrosion and abrasion. In particular, the matrix significantly lowers the permeability of corrosive elements in the environment, such as moisture, trace amount of acids, oxygen, sulfur and the like.

In addition, the matrix offers favorable physical and mechanical properties to the conductive layer. For example, it can provide adhesion to the substrate. Furthermore, unlike metal oxide films, polymeric or organic polymers or pre-polymers have become a better matrix to embed metal nanowires, because they can be robust and flexible, which make it possible to fabricate transparent conductors in a low-cost, high throughput process.

But in general, the matrix materials are less conductive than metal nanowire network, or some matrix materials are not conductive at all. Embedding the virgin metal nanowires in a polymer matrix, reduces the conductivity of the film. Some electrode actually requires portions of the nanowires protrude from the matrix material to enable access to the conductive network, or to make it surface conductive.

In view of the foregoing, an alternative method to protect the metal nanowires and improve adhesion is need. Even when a matrix is to be used, a composition or method to improve the conductive of the matrix is also needed.

SUMMARY OF THE INVENTION

Herein, a transparent conductive electrode having surface functionalize metal nanowires, is disclosed. The surface functionalized metal nanowires provide a better approach to protect the metal nanowires in the conductive electrode and improve adhesion between conductive layer to the substrate, and adhesion between the conductive layer and the subsequent layers in the device employing the electrode.

The surface functionalized metal nanowire can be more readily dispersed in the conductive film. The surface functionalization can be tuned to protect the metal nanowire from oxidation and expose certain surface of the metal nanowire to make it surface conductive. In addition, conductive electrode having surface functionalized metal nanowires can be conductive at lower percolation levels, and the surface functionalization provides improved the adhesion between the metal nanowire with the substrate, the binders of the conductive films or other layers in a device when the electrode is fabricated as either a bottom or top electrode in a optical electrical device.

Moreover, the surface functionalization can be tailored by selecting appropriate functional groups at desired concentration. For example, the function groups can reduce the reflection loss and unwanted glare effectively by using a group giving a desirable refractive index, at a favorable length or concentration.

Further, these nanowires after surface functionalization can retain their electrical conductivity but lose their optical luster. This is a key enabler for making ultra-low haze (haze<0.5) silver nanowire based conductive film. One of current key challenges for silver nanowire based TCE is their high haze at low sheet resistance.

In a first aspect of the present invention, in one embodiment, a transparent conductive electrode is disclosed. The transparent conductive electrode comprises a substrate, and a substantial single conductive layer deposited on the top of the substrate, wherein the substantial single conductive layer comprise a surface functionalized metal nanowires. In one example, the surface functionalized metal nanowires are metal nanowires having surface functionalized core-shell structure with silver core and silver halide protective shell. In another example, the surface functionalized metal nanowires are metal nanowires having surface functionalized core-shell structure with silver core and silver oxide protective shell.

In a first aspect of the present invention, in another embodiment, a method to make a transparent conductive electrode is disclosed, wherein transparent conductive electrode comprises a substrate, and a substantial single conductive layer deposited on the top of the substrate, wherein the substantial single conductive layer comprise a surface functionalized metal nanowires. In one example, the surface functionalized metal nanowires are metal nanowires having surface functionalized core-shell structure with silver core and silver halide protective shell. In another example, the surface functionalized metal nanowires are metal nanowires having surface functionalized core-shell structure with silver core and silver oxide protective shell.

In a second aspect of the present invention, in one embodiment, a patterned transparent conductive film is disclosed. The patterned transparent conductive film comprises a substrate and a substantial single layer on top of the substrate, comprising a first region comprising a network of silver nanowires and means for protecting the nanowire from surface oxidation; and a second region, comprising a plurality of metal nanowires and means for protecting nanowire from surface oxidation, and metal oxide nanowires.

In a second aspect of the present invention, in another embodiment, a patterned transparent conductive film is disclosed. The patterned transparent conductive film comprises a substrate and a substantial single conductive layer on top of the substrate. The substantial single conductive layer comprises a first region comprising a network of silver nanowires; and a second region, comprising metal nanowires having an average length shorter than the first region.

In a third aspect of the present invention, in one embodiment, a method of patterning a conductive electrode is disclosed. The method comprises providing a substrate,
forming a film comprising a first region having a plurality of metal nanowires, wherein at least some of metal nanowires are surface functionalized and inert to oxidation or acid reactions;
evaporating away the solvent in the metal nanowire film;
exposing the nanowire film to a chemical reagent;
forming a second region comprising nanowires, and
annealing the film having the first and second region,
wherein the resistivity difference between the first and second region is more than 1000.

In a third aspect of the present invention, in one embodiment, a method of patterning a conductive electrode is disclosed. A method of patterning the conductive electrode comprises
providing a substrate,
forming a film comprising a surface functionalized silver nanowire wherein some portion of the nanowire is surface functionalized and inert to oxidation or acid etching,
exposing the film to etchants or oxidants and reacting the nanowire with oxidants/acids,
disintegrating the unprotected non-surface functionalized portion of nanowire into segments; wherein the arrangement of surface functionalized portions and non-surface functionalized portions on a nanowire can be regularly or randomly pitched.

BRIEF DESCRIPTION OF THE FIGURES

The invention and the detailed description thereof may be understood by reference to the following figures:

FIG. 1 is an exemplary nanowire, having a diameter of d and length L;

FIGS. 2a-e are schematic illustrations of cross section views of different nanowires in accordance with the aspects of the present invention;

FIG. 8a is an illustration of the composition of another exemplary metal nanowire having self assembly monolayer in the conductive film;

FIG. 8b is an illustration of the composition of another exemplary metal nanowire in the conductive film after the reaction with acid or oxidation;

FIG. 13b is a zoomed-in image of part of FIG. 13a.

DETAILED DESCRIPTION OF SELECTED EXAMPLES

Figure 3:
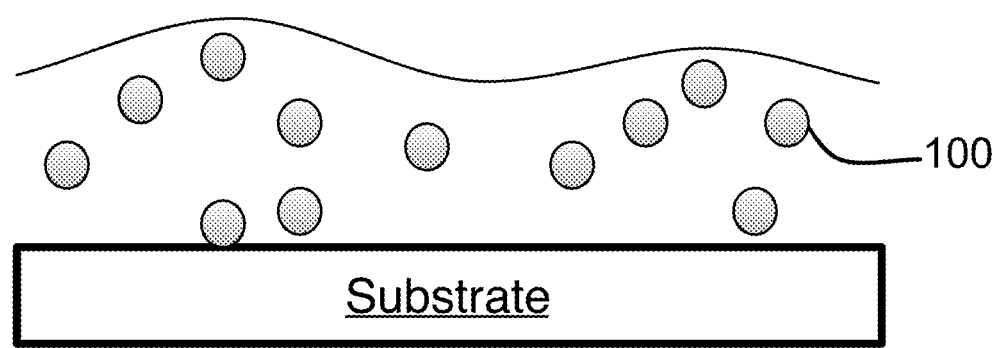
FIG. 3 is a schematic diagram of a single layer conductive film, in accordance with the aspects in the present invention.

Hereinafter, selected examples of methods for making a transparent conductive films will be discussed in the following with reference to the accompanying drawings. It will be appreciated by those skilled in the art that the following discussion is for illustration purposes, and should not be interpreted as a limitation. Other variances within the scope of this disclosure are also applicable.

General Description

"Optional" or "optionally" means that the subsequently described circumstance may or may not occur, so that the description includes instances where the circumstance occurs and instances where it does not.

In the scope of the present invention, printing, wet coating and alike are all referred to the general category of a wet coating method, including inject printing, spray printing, nozzle printing, gravure printing, screening printing, etc. Printing and coating can be used interchangeably.

Nanowires

In accordance with the aspects with the present invention, nanowires have a cylindrical shaped, having a diameter d and length L as shown in FIG. 1. The aspect ratios of nanowires are L/d. Suitable aspect ratios of the nanowires are between 100 to 100,000. In one preferred example, the aspect ratios of the nanowires are more than 1000, in order to provide a transparent conductive film, because longer and thinner nanowires may enable more efficient conductive networks while permitting lower overall density of wires for achieving a higher transparency.

Metal Nanowires

As known in the art, conductive nanowires include metal nanowires and non-metallic nanowires. In general, "metal nanowire" refers to a metallic wire comprising element metal and metal alloys. Non-metallic nanowires include, for example, carbon nanotubes (CNTs), conductive polymer fibers and the like.

In accordance with the aspects of the present invention, metal nanowires refers to substantially elemental metal and metal alloys. Optionally, the metal nanowires may have less than 5-10% (by moles) of metal oxides. Metal oxides may exist in the metal nanowire shell or core as an impurity or defect in the nanowire synthesis.

In accordance with the aspects of the present invention, metal oxide nanowires refers to the nanowires are substantially metal oxides. Optionally, metal oxide nanowires may have less than 5-10% (by moles) of elemental metal, due to incomplete oxidation or any other reasons.

In accordance with the aspects of the present invention, hybrid nanowires are metal/metal oxide nanowires, wherein the nanowires, having both elemental metal and metal oxides as major components. Metal/metal oxide hybrid nanowires may comprise 40% (mole %) metal oxide and 60% (mole %) elemental metal. Metal/metal oxide hybrid nanowires may comprise 60% (mole %) metal oxide and 40% (mole %) elemental metal.

The diameters of the metal nanowires, metal oxide nanowires, or hybrid nanowires are less than 200 nm, and less than 100 nm, and more preferably less than 50 nm.

Suitable elemental metal employed in nanowires can be based on any metal, including without limitation, silver, gold, copper, nickel, and gold-plated silver. In one example, silver nanowires are used to make the conductive electrode film because of the small refractive index difference between elemental silver and silver oxide.

Optionally, the metal nanowires, metal oxide nanowires and hybrid nanowires, further comprises other minor component, for example, but not limited to, seeding element from the nanowire synthesis.

In one embodiment of the present invention, FIGS. 2a-e are schematic illustrations of the cross section views of different nanowires. FIG. 2a is an exemplar metal nanowire. FIG. 2b is an exemplar metal/metal oxide hybrid nanowire, wherein the metal oxide and metal are arranged in a core shell structure, having metal nanowire form the core and metal oxide become the shell wrapping around the core.

FIG. 2c is an exemplar metal/metal oxide hybrid nanowire, wherein the metal oxide and metal are arranged in a pseudo core shell structure, wherein the "core" has more elemental metal than the metal oxide and the "shell" has more metal oxide than elemental metal. In one example, FIG. 2c occurs as the result of an oxidation reaction on a metal nanowire, wherein only the exposed elemental are oxidized and the surface of the metal nanowire does not get exposed equally to the oxidative reagent or condition. FIG. 2d is an exemplar metal/metal oxide hybrid nanowire, wherein the metal oxide and metal are arranged randomly, but still having a pattern that there are more metal oxide on the surface of the nanowire, and there is less metal inside the nanowire. FIG. 2e is an exemplar metal oxide hybrid nanowire, wherein both the core and shell of the nanowire are predominantly metal oxide.

In another embodiment of the present invention, FIGS. 2a-e are schematic illustrations of the cross section views of different nanowires, FIG. 2a is an exemplar elemental metal nanowire. FIG. 2b is an exemplar metal/metal halide hybrid nanowire, wherein the metal halide and metal are arranged in a core shell structure, having metal nanowire form the core and metal halide become the shell wrapping around the core. FIG. 2c is an exemplar metal/metal halide hybrid nanowire, wherein the metal halide and metal are arranged in a pseudo core shell structure, wherein the "core" has more elemental metal than the metal halide and the "shell" has more metal halide than elemental metal. In one example, FIG. 2c occurs as the result of an oxidation reaction on a metal nanowire, wherein only the exposed elemental are oxidized and the surface of the metal nanowire does not get exposed equally to the oxidative reagent or condition. FIG. 2d is an exemplar metal/metal halide hybrid nanowire, wherein the metal halide and metal are arranged randomly, but still having a pattern that there are more metal halide on the surface of the nanowire, and there is less metal inside the nanowire. FIG. 2e is an exemplar metal halide hybrid nanowire, wherein both the core and shell of the nanowire are predominantly metal halide.

FIGS. 2a-e are exemplar illustrations and should not be construed as limitations. The contours of the nanowires, if are marked, it is only intended for clarity purposes. The interfaces and boundaries between different chemical components are either visible or not visible. It is depends on the refractive index of the metal and metal oxide, or metal and metal halide.

Optical and Electrical Characteristics of the Nanowires

Generally for a single nanowire, its resistivity is based on its diameter. The larger the diameter of the nanowire, the smaller the resistivity or it is more conductive. However, the larger the diameter of the nanowire, it blocks more light and become less transparent. Therefore an optimal diameter range is desired in order to achieve both highly conductive and highly transparent metal nanowires.

In addition, in order for a metal nanowire to be conductive across a substrate either laterally or horizontally, the single metal nanowire (s) needs to 1) extends through a region or to 2) be connected to a number of other nanowires. Therefore the longer the single nanowire length, in principle the longer the conductive pathway. In typical examples of the present invention, an aspect ratio above 1000 is desired.

Conductive Film

In accordance with the aspects of the present invention, when a plurality of nanowires is deposited onto a substrate to make a conductive film, the film formed is substantially a single layer. In the conductive film, the nanowires are arranged at least above a minimal concentration, so called percolation threshold, so that the nanowires are not spaced too far apart from each other to form a conductive pathway.

When a plurality of single nanowires is networked together to form a multiple interconnected conductive pathways, said plurality of the nanowires is referred to as clusters. When two or more nanowire clusters are networked together, a conductive layer or film is formed. In accordance with the aspect of the present invention, nanowire clusters has size of less than 200 nm in one dimension, more typically less than 100 or 50 nm in one dimension.

As used herein, "a single layer" or "a substantial single layer" is generally less than 150 nm, which is about three-nanowire thickness. More typically, "a single layer" or "a substantial single layer" is generally less than 100 nm, two-nanowire thickness. Preferably, "a single layer" or "a substantial single layer" is generally 50 nm or less, one nanowire thickness. In various embodiments, the thickness of the nano-clusters are in the range of 10 to 40 nm, 20 to 40 nm, 5 to 20 nm, 10 to 30 nm, 40 to 60 nm, 50 to 70 nm.

The clusters are formed by nanowires isotropically or an isotropically. The nanoclusters can also have a pseudo diameter, pseudo length and pseudo aspect ratio. Lengthwise, anisotropic nanoclusters (e.g., a plurality networked nanowires, pseudo aspect ratio does not equal to one) are more than 500 nm, or more than 1 μm, or more than 10 μm in length. In various embodiments, the lengths of the nano-clusters are in the range of 5 to 30 μm, or in the range of 15 to 50 μm, 25 to 75 μm, 30 to 60 μm, 40 to 80 μm, or 50 to 100 μm.

In accordance with the aspects of the present invention, when the conductive film is patterned into conductive regions and non-conductive regions, conductive regions comprise interconnected or networked nanoclusters, whereas the non-conductive region comprise segregated or isolate nanoclusters.

In accordance with the aspects of the present invention, when the metal nanowire is silver nanowire, one silver nanowire is present in a nanocluster. In one example, said silver within the nanocluster is oxidized into a silver oxide nanowire. The interruption in the conductive pathway turned connected nanoclusters into isolated nanoclusters, which further turning a region from conductive region into a nonconductive region.

The conductive films described herein, are having conductive regions and non conductive regions. Conductive regions and nonconductive regions are together referred as patterns in the conductive film. In accordance with aspects of the present invention, in one embodiment, the nonconductive regions are formed from the conductive regions through oxidation, photo oxidation reaction or even fragmentation reactions. As a result, the nonconductive regions comprise nanowires having metals in the oxidative states and metal nanowires are shorter in length than that of conductive regions (parent). The conductive regions typically comprise metal nanowires having high aspect ratios. Optionally, the conductive region may further comprise metal nanowires having surface functionalization means, protecting the metal nanowires from undergo undesired oxidation, photo-oxidation or fragmentation.

In view of the foregoing discussion, the present invention discloses patterned conductive films with excellent optical properties, electrical properties and mechanical properties. The patterned transparent conductive films disclosed herein have an optical transmittance higher than 90%, a haze value less than 2%, and typically less than 1%, while maintaining the sheet resistance lower than 100 Ohms/sq and typically less than 50 Ohms/sq.

Super Long and Thin Nanowires

The patterned conductive film in the present invention comprises a substrate, and a substantially single layer of conductive materials deposited on top of the substrate. The single layer conductive material comprises one or more metal nanowires. Longer and thinner than conventional metal nanowires are employed in the film to achieve high transparency, low haze and high conductivity in the conductive region and high resolution in the patterned conductive film.

In one embodiment of the present invention, the patterned transparent conductive film comprises nanowires having a longer than usual length and thinner than usual diameters. The usual length is defined as about 10-20 micrometers in length and the usual diameters are defined as about 50-100 nm in diameters in the scope of the present invention.

Transparent conductive films in the art typically employing metal nanowires having diameters around 50-100 nm, with 10-20 micrometers in length. The patterned transparent conductive films disclosed in the present invention, comprises metal nanowires are less than 50 nm in diameters and longer than about 20-100 micrometers. In one preferred example of the present invention, the patterned transparent conductive film comprises nanowires having less than 30 nm in diameters. The longer and thinner metal nanowires significantly reduces the amount of light scattering and the contrast between the areas having nanowires and the areas without, leading to a conductive film with lower haze. In addition, the longer than usual nanowires further facilitates the electron transport within the conductive region of the film, leading to improved electrical conductivity and reduced sheet resistance. In the examples of the present invention, the patterned transparent film comprises metal nanowires having less than 50 nm in diameters and 20-100 micrometers in length, have an optical transmittance higher than 90%, a haze value less than 0.6%, while maintaining the sheet resistance lower than 50 Ohms/sq.

The unusual long and unusual thin metal nanowires can be made by a two-step synthesis method. Apart from the conventional one step process of making metal nanowires in the art, which typically lead to metal nanowires 80-100 nm in diameters and 20-30 micrometers in length, the method disclosed in the present invention comprises a two-step process. A first step is a proceeding step, forming most of the nanowire nucleation seeds. A second step is a growing step, where the nucleation seeds grow preferentially in one dimension in a controlled manner. Further, the nucleation seeds can be purified before being used in the growing step. Subsequently, the metal nanowires collected after the growing step can be further purified to have nanowires with even narrower distribution in length and diameters. Comparing the conventional one step method, the two-step process has two advantages. First, the proceeding step incubates the formation of the nucleation seed, which significantly reduces the concentration of the nanowire "growing centers". Second, the growing step is conditioned that the precursors are continuously growing in one predetermined direction in length, thus reducing the formation of junctions and branches in the metal nanowire network.

Substrate

In accordance with the aspects of the present invention, substrate refers to a material onto which the conductive layer is coated on top of. The substrate can be either rigid or flexible. The substrate is preferred to be highly transparent in the visible wavelength. Exemplar rigid substrates include, glass, polycarbonates, particularly high refractive index polycarbonates, acrylics, and the like. Exemplar flexible substrates include, but are not limited to: polyesters (e.g., polyethylene terephthalate (PET), polyester naphthalate (PEN), and polycarbonate, polyolefins (e.g., linear, branched, and cyclic polyolefins), and other conventional polymeric films.

Properties of a the Patterned Film

Typically, the optical transparence or clarity of the conductive film can be quantitatively defined by parameters including light transmission and haze. "Light transmission" refers to the percentage of an incident light transmitted through a medium. In various embodiments, the light transmission of the conductive layer is at least 90% and can be as high as 98%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In various embodiments, the haze of the patterned transparent conductive film is no more than 5% and may be as low as no more than 2% to 0.5%.

Wet Coating Process

The transparent conductive film can be fabricated by any feasible wet coating method, including sheet coating, webcoating, printing, spraying, gravure printing, and slot die coating, transfer printing or lamination. If the substrate is a flexible substrate, roll to roll coating is preferred for large area and high throughput. Sheet Coating or lamination is more suitable when the conductive film is formed on top of rigid substrate, for example glass. Both roll-to-roll or sheet coating can be fully automated to dramatically reduces the cost of fabricating transparent conductive films. All the patterning methods described herein, can be run on a fully integrated line, or serially in parallel processes.

Composition 1

As an illustrative example, FIG. 3 shows a patterned transparent conductive film comprising a substrate and a substantial single layer coated on the substrate. The single layer comprises a plurality of metal nanowires. The metal nanowires form a conductive network. The film comprises a first region and second region, which is not shown from this cross sectional view.

The present invention is directed to a composition and method of manufacturing nanowire based conductive film. Said nanowire based film has a pattern invisible to the human eye. Invisible to the human eye means the interface between the regions in the patterned conductive film is not visible when observing under the visible light.

The present invention is directed to a composition and method of manufacturing a nanowire based conductive film. The film comprises a first region comprising a first material and a second region comprising a second material, wherein the difference of refractive index between the first and second region is less than 0.05.

The present invention is directed to a composition and method of manufacturing a nanowire based conductive film. The film comprises a first region comprising a first material and a second region comprising a second material, wherein at least one dimension of the second region is less than 10 um. Optionally, one dimension of the second region is longer than 50 um. Optionally, one dimension of the second region less than 5-10 um.

The present invention is directed to a composition and method of manufacturing a nanowire based conductive film. The film comprises a first region comprising a first material and a second region comprising a second material, wherein the distance between one first region to another first region is longer than 5 um. Optionally, the distance between one first region to another first region is longer than 10 um.

The pattern comprises electrical conductive regions and electrical non-conductive regions. The refractive index difference between the electrical conductive region and electrical non-conductive regions is less than 0.05. The transmittance difference between the electrical conductive region and electrical non-conductive regions is less than 0.05. The haze differences between the electrical conductive region and electrical non-conductive regions is less than 0.3-0.5 The sheet resistance of electrical conductive regions are less than 300 $\Omega$/sq. The sheet resistance of electrical non-conductive regions are more than 1000 $\Omega$/sq.

The pattern comprises electrical conductive regions and electrical non-conductive regions. The conductive region is converted into the non-conductive regions by an oxidation reaction.

In one example of the present invention, the first region of the film comprises silver nanowire. Upon reaction with a chemical solution, silver is converted into silver oxide, which forms the second region. The refractive index of the film containing silver metal is 1.6 and the refractive index of the film containing silver oxide is 1.59. The refractive index difference between the silver metal and silver oxide is 0.01. The chemical solution is anything capable of oxidizing silver into silver metal, for example an oxidizing agent solution. The silver is the sole or primary conductive material for the conductive region and silver oxide is the sole or primary converted material for the non-conductive region.

In a further example, when the silver nanowire is oxidized to form the second region, it forms a silver oxide/silver hybrid nanowire (FIG. 2a-e). In one instance of the present example, the silver oxide/silver is arranged in a core shell structure, wherein silver nanowire is the core, and the silver oxide forms the shell coating over the silver nanowire core. In another instance of the present invention, the silver oxide/silver is arranged in a pseudo core shell structure, wherein the surface of the hybrid nanowire has more silver oxide than silver, and the core of the hybrid nanowire has more elemental silver than silver oxide. In still another instance of the present invention, the silver oxide is formed randomly in the silver nanowire. In yet another instance, when silver is oxidized into silver oxide to form the second region, it oxidation undergo to the completion and yield silver oxide nanowire.

In one example of the present invention, the first region of the film comprises silver nanowire. Upon reaction with a chemical solution, silver is converted into a silver salt. Examples of the silver salt includes silver halides, silver nitrate and silver sulfate, and the like. The refractive index of the film containing silver metal is 1.6 and the refractive index of the film containing silver oxide is 1.59. The refractive index difference between the silver metal and silver oxide is 0.01. The chemical solution is anything capable of oxidizing silver into silver metal, for example an acid solution. The silver is the sole or primary conductive material for the conductive region and silver oxide is the sole or primary converted material for the non-conductive region.

The first region, an electrical conductive region, and the second region, a non-electrical conductive region, as formed based on the disclosure herein, has a conductivity ratio of the conductive region over non conductive region more than 1000, and wherein the conductive region and the non conductive region are optically uniform.

Methods 1-3

A patterned conductive film can be formed by selectively oxidizing the nanowire region. The oxidizing agent can be placed onto the conductive film after the film of metal nanowire is formed. Alternative, the oxidizing agent can be mixed into the nanowire ink and made into the nanowire film.

The curing process can be carried out photolytically or thermally. FIGS. 4a-d illustrates an embodiment in which a conductive layer is thermally-patterned. FIGS. 5a-d and 6a-d illustrates an embodiment in which a conductive layer is photolytically patterned.

In some embodiments, thermal-patterning can be carried out using an insulating thermal mask (e.g., an aperture mask), which only exposes regions to be converted to a heat source.

In other embodiments, photolytically patterning can be achieved by using a mask. In such a process, the mask provides areas of openings and areas of shadows, wherein the openings permits the UV through to convert the metal nanowires to metal oxides while the shadows protecting the metal nanowire in the conductive region to be oxidized.

Alternatively, both thermal-patterning or photolytically patterning can be achieved using a mask-less approach. In a mask-less approach, the oxidizing agent directly-written onto the layer or film of metal nanowire in a predetermined pattern. Applying heat or UV radiation throughout the film can only create oxidation reaction in the areas where the oxidizing chemicals are deposited, thus leading to the predetermined patterns.

Both the photo-patterning method and thermal-patterning method are compatible with wet coating process described, which are easily scalable to large areas of substrates and offers low cost high throughput manufacturing.

The present invention provides a method to make patterned transparent conductive film. The patterned transparent film comprises two regions, a first region, a conductive region and a second region, non-conductive region, wherein the first region is converted to a second region by an oxidation reaction.

First, a substrate is cleaned and a first solution comprising metal nanowires, preferably silver nanowires are coated onto the substrate. After drying to remove the solvent, a film of metal nanowire network 102 is formed.

Figure 4A:
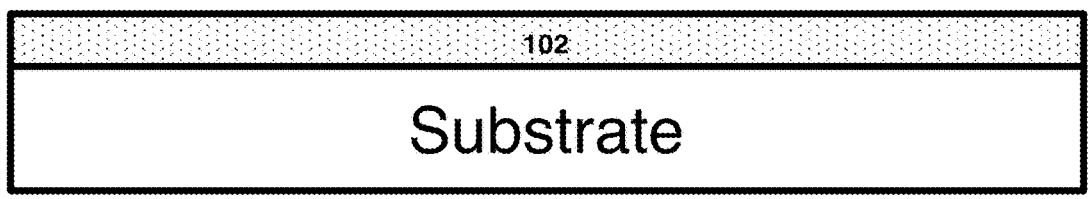
FIG. 4a is a cross-section diagram of an exemplary metal nanowire network on the substrate.
Figure 4B:
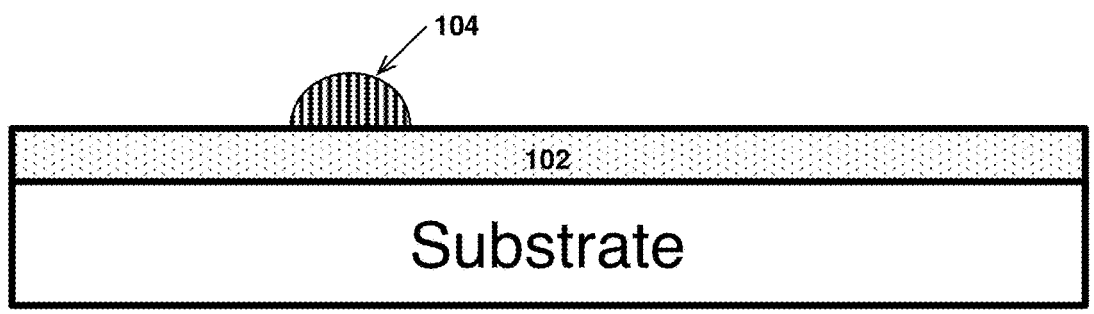
FIG. 4b and c are illustrations of the cross sections of the films when a second solution is printed onto the substrate and nanowire network.

Referring to FIG. 4b, then a second solution 104 is printed onto surface of the nanowire film 102 in designated areas. Depends on the resolution and throughput requirement, various printing method can be used to deliver the second solution to the surface of the nanowire film. In one example, ink jet printing is used and distance between one conductive region to another conductive region is at least 5 um. In another example, screen printing is used and distance between one conductive region to another conductive region is at least 50 um. In another example, gravure printing is used and distance between one conductive region to another is at least 1 um. In another example, the substrate can first be masked with photoresist patterns and then immersed into a bath of the second solution. The distance between one conductive region to another conductive region is defined by the photoresist pattern and can be at least 0.5 um.

Upon drying, the solvent in the second solution is evaporated and the area contacted with solution 104 is converted to 106, wherein 102 and 106 has different chemical composition.

Optionally, refer to FIG. 3, before the solvent of the second solution 104 is evaporated, heating is employed is facilitate the chemical oxidation from 102 to 106.

After the removal of solution 104, 102 is converted into 106. In one example, 102 is a conductive region and 106 is non conductive region. 102 is a film containing silver nanowire network and 106 is the film containing metal oxides of the silver metal, or partially oxidized silver nanowires, or shorter nanowires not overlapping with each other, a less conductive or non-conductive region.

The present invention provides a method to make patterned transparent conductive film. The patterned transparent film comprises two regions, a first region, a conductive region and a second region, non-conductive region, wherein the first region is converted to a second region by a reduction reaction.

First, a substrate is cleaned and a first solution comprising metal oxide nanowires, preferably silver oxide nanowires or composite fibers with silver oxide are coated onto the substrate. After drying to remove the solvent, a film of metal oxide nanowire network 102 is formed.

Referring to FIG. 4b, then a second solution 104 is printed onto surface of the nanowire film 102 in designated areas. Depends on the resolution and throughput requirement, various printing method can be used to deliver the second solution to the surface of the nanowire film. In one example, ink jet printing is used and distance between one conductive region to another conductive region is at least 10 um. In another example, screen printing is used and distance between one conductive region to another conductive region is at least 50 um. In another example, gravure printing is used and distance between one conductive region to another is at least 1 um. In another example, the substrate can first be masked with photoresist patterns and then immersed into a bath of the second solution. The distance between one conductive region to another conductive region is defined by the photoresist pattern and can be at least 0.5 um.

Upon drying, the solvent in the second solution is evaporated and the area contacted with solution 104 is converted to 106, wherein 102 and 106 has different chemical composition, 102 is the oxide(s) or oxidation state of 106.

Figure 4C:
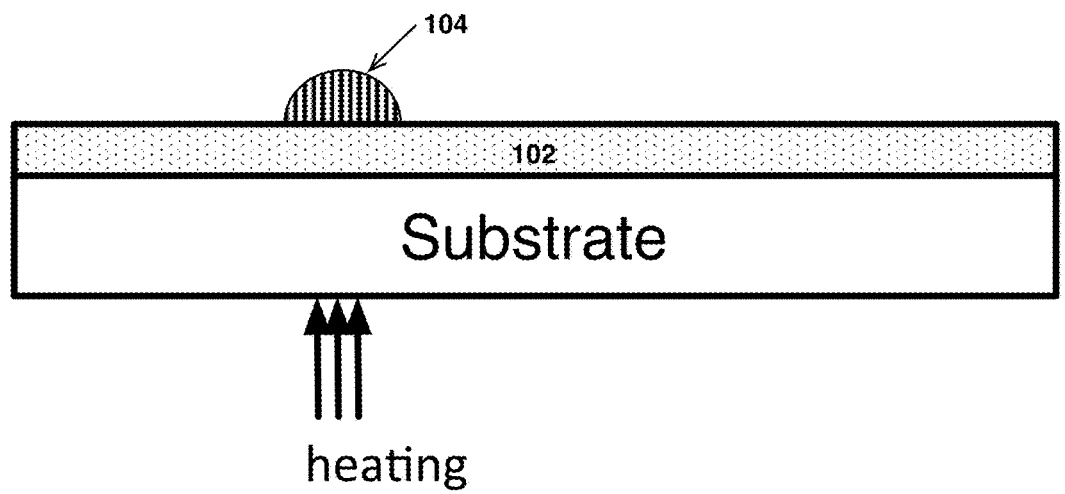
FIG. 4d is an illustration of the cross section of the film after the second solution reacted into the nanowire network.
Figure 4D:
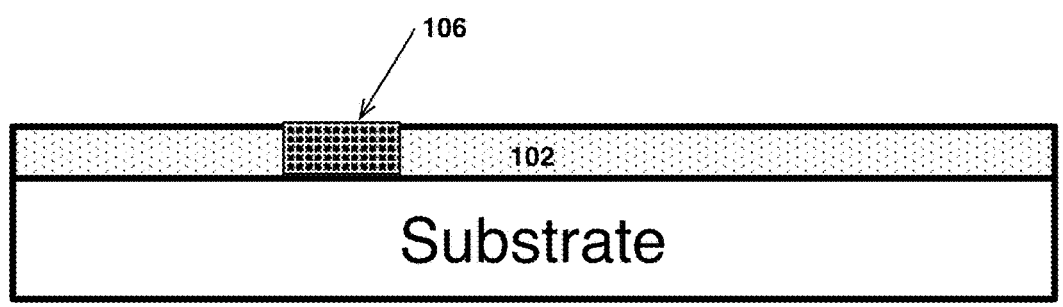

Optionally, refer to FIG. 4c, before the solvent of the second solution 104 is evaporated, heating is employed is facilitate the chemical reduction conversion from 102 to 106.

After the removal of solution 104, 102 is converted into 106. In one example, 102 is a less conductive region and 106 is a more conductive region. In one preferred example, the 102 is silver oxide and 106 is silver metal.

Oxidizing Agents

Oxidizing agents can be anything as long as the chemical agent is strong enough to convert elemental metal to metal oxide, particularly converting silver into silver oxide. In one preferred example, the oxidizing agent is a photo-acid generator. The advantage of using photo-acid generator over other oxidizing agent is it can be removed relatively easily after the pattern is made. The photo-acid generator can be directed printed onto the nanowire surface as in FIG. 4b, and the followed the process illustrated in FIGS. 4a-d to create patterns. Or the photo-acid generator can be mixed with the nanowires solution and printed onto the substrate together as in FIG. 5a, and the followed the process illustrated in FIGS. 5a-d to create patterns. Or the photo-acid generator can be printed as a separate player (107) onto the nanowire surface as in FIG. 6b, and the followed the process illustrated in FIGS. 6a-d to create patterns.

Example 1 of Using a Photo Acid Generator

In some embodiments, the present invention is directed to a composition and method of manufacturing a nanowire based conductive film. The film comprises a first region comprising a first material and a second region comprising a second material. In some examples, the second material is generated from the first material by a combination of UV light and photo acid generator.

In one example of the present invention, the first region of the film comprises silver nanowire and at least one photosensitive compound. Upon irradiation with UV light, the photosensitive compound degrades to generate acid, which converts silver into silver oxide. The refractive index of first region containing silver metal is 1.6 and the refractive index of the silver oxide is 1.59. The refractive index difference between the silver metal and silver oxide is 0.01.

The present invention provides a method to make patterned transparent conductive film. The patterned transparent film comprises two regions, a first region, a conductive region and a second region, less-conductive or non-conductive region, wherein the first region is converted to a second region by a photo oxidation reaction.

First, a substrate is cleaned and a first solution comprising metal nanowires, preferably silver nanowires, together with at least one photo acid generator, are coated onto the substrate. After drying to remove the solvent, a film of metal nanowire network 103 comprising photo acid generator is formed.

Figure 5A:
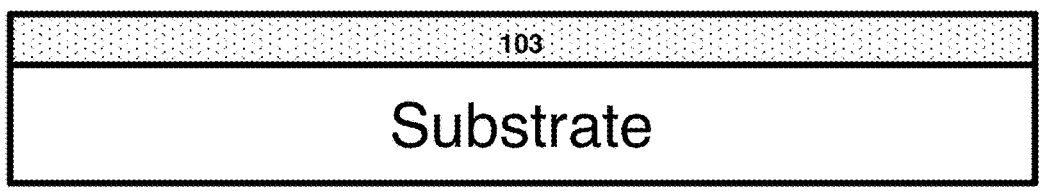
FIG. 5a is a cross-section diagram of an exemplary metal nanowire network on the substrate.
Figure 5B:
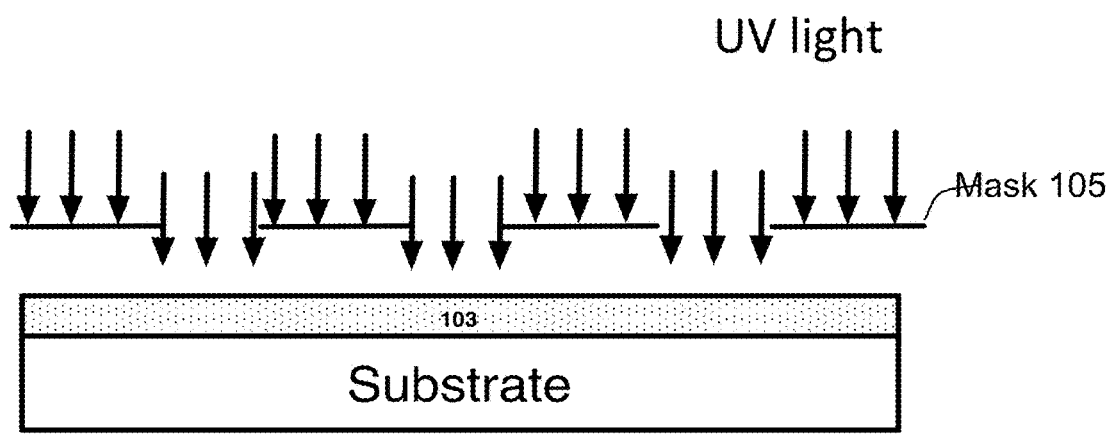
FIG. 5b is an illustration of the cross section of the film when a mask is positioned above the substrate and nanowire network.

Referring to FIG. 5b, then a mask 105 is then positioned above the surface of the nanowire film 103. The mask has designated openings, allowing UV light to pass through.

Figure 5C:
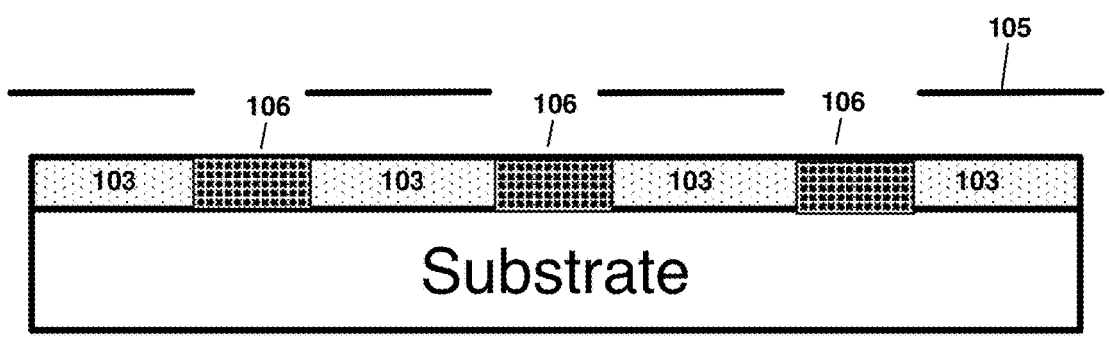
FIG. 5c-d are illustrations of the cross section of the film after the UV radiation.

Upon UV radiation, referring to FIG. 5c, the photo acid generator, in the area exposed to the UV light, is activated, converting the metal nanowire into the corresponding metal oxide.

Figure 5D:
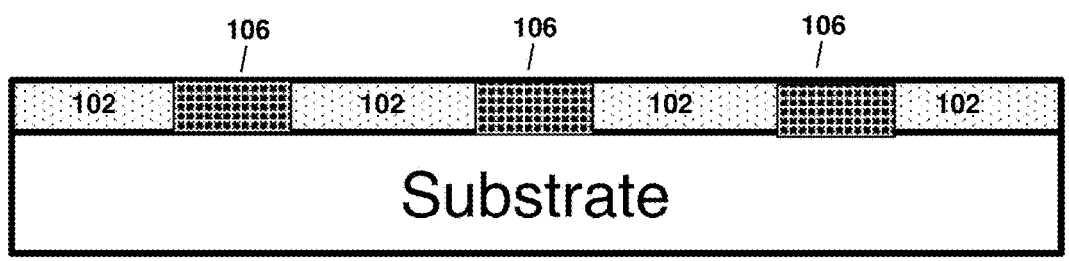

After the oxidation reaction, heating the film decompose unreacted photo acid generator as shown in FIG. 5d. 103 is converted into a metal nanowire network 102. The film is absent from photo acid generator.

Example 2 of Using a Photo Acid Generator

The present invention provides a method to make patterned transparent conductive film. The patterned transparent film comprises two regions, a first region, a conductive region and a second region, less-conductive or non-conductive region, wherein the first region is converted to a second region by UV radiation.

Figure 6A:
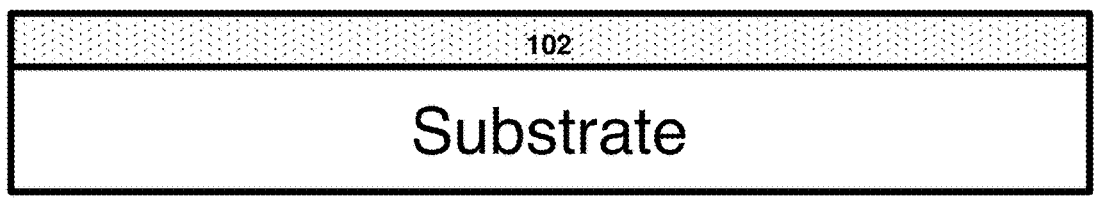
FIG. 6a is an illustration of an exemplary metal nanowire.

First, as shown in FIG. 6a, a substrate is cleaned and a first solution comprising metal nanowires, preferably silver nanowires, are coated onto the substrate. After drying to remove the solvent, a film of metal nanowire network 102 is formed.

Figure 6B:
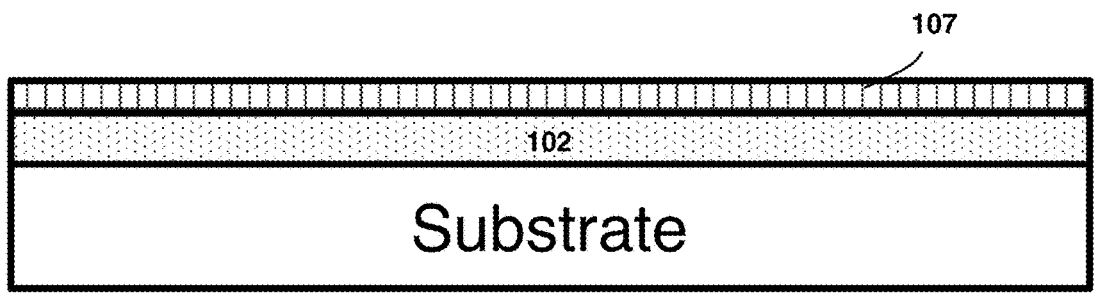
FIG. 6b is an illustration of an exemplary metal nanowire after acid or oxidant exposure.
Figure 6C:
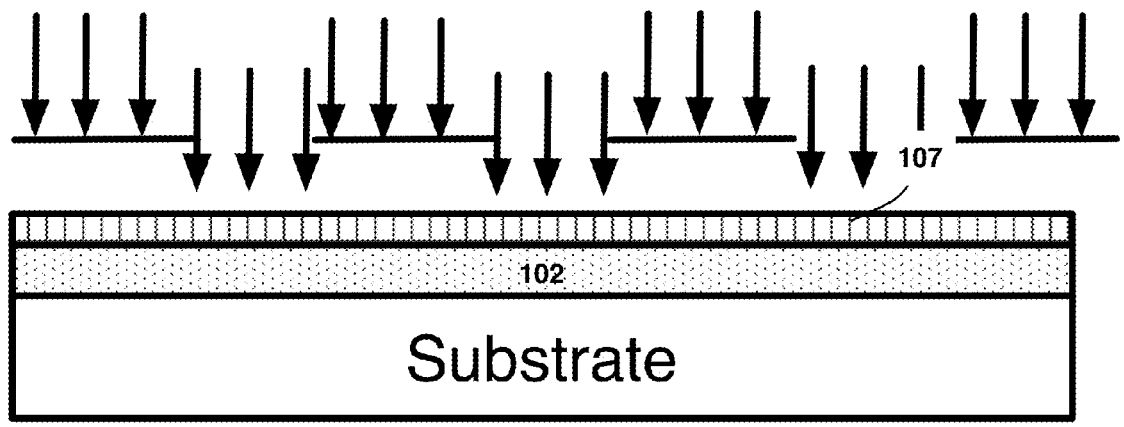
FIG. 6c is an illustration of the composition of another exemplary metal nanowire in the conductive film.

Referring to FIG. 6b, subsequently, another layer 107 comprising photo acid generator is deposited directly on top of the film 102. In the film 107, photo acid generator is homogenously spread throughout the film.

Figure 6D:
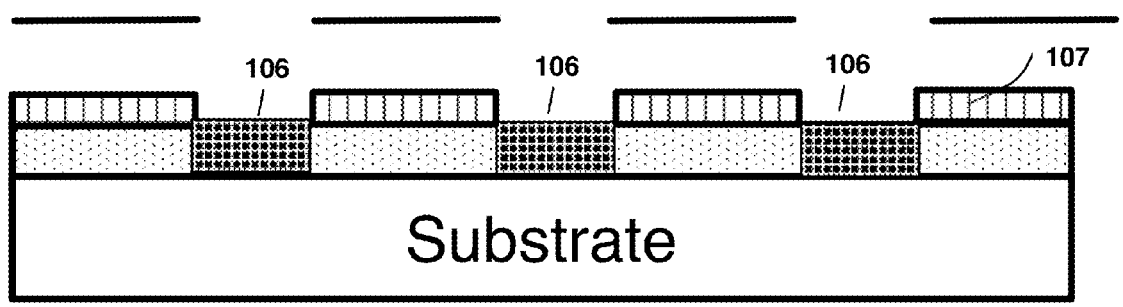
FIG. 6d is an illustration of the composition of another exemplary metal nanowire in the conductive film after the reaction with acid or oxidation.

Then, a mask 105 is then positioned above the surface of the layer 107. The mask has designated openings, allowing UV light to pass through. The photo acid generator in the area exposed to the UV light is activated, converting the metal nanowire 102 into the corresponding metal oxide 106, as illustrated in FIG. 6d.

After the oxidation reaction, unreacted photo acid generator 107 as shown in FIG. 8, is washed away or decomposed by heating. The final product comprises a silver nanowire region and an oxidative product of silver nanowire region.

In accordance with the present invention, photo acid generator can be deposited onto the substrate by any wet coating method. The printing, wet coating and alike are all referred to the general category of a wet coating method, including inject printing, spray printing, nozzle printing, gravure printing, screening printing, etc. Printing and coating can be used interchangeably.

Examples of photo acid generators include, but are not limited to, the non-ionic and ionic photoacid generators from BASF, such as Irgacure PAG 103, Irgacure PAG 121, Irgacure PAG 203, CGI 725, CGI 1907, Irgacure 250, Irgacure PAG 290, and GSID26-1.

In one embodiment of the present invention, the film of nanowires is first prepared on top of a substrate. IR laser is shined onto the film of nanowire through a photo mask while heating. In one example, the substrate and the nanowire film are heated at 250 C for 10 min. In another example, the substrate and the nanowire film are heated at 300 C for 1 min. The heating temperature and time is optimized according the size of the substrate, and other process parameters and economics.

In another embodiment of the present invention, the film of nanowire are first prepared on the top of the substrate. After drying, a solvent is introduced into the nanowire network. The solvent can be introduced by ink jet printing or spray coating through a mask, or a gravure printing. The solvent swells the nanowire network, changes the arrangement of the metal nanowire network by dissolving or partially dissolving the binder or other organic modifier in the film. As a result the rearrangement of the metal nanowires can cause isolate nanowire clusters which makes the film less or not conductive. Exemplar solvent includes alcohol-based solvents, such as isopropanol.

Method 5-Surface Functionalization

Figure 9A:
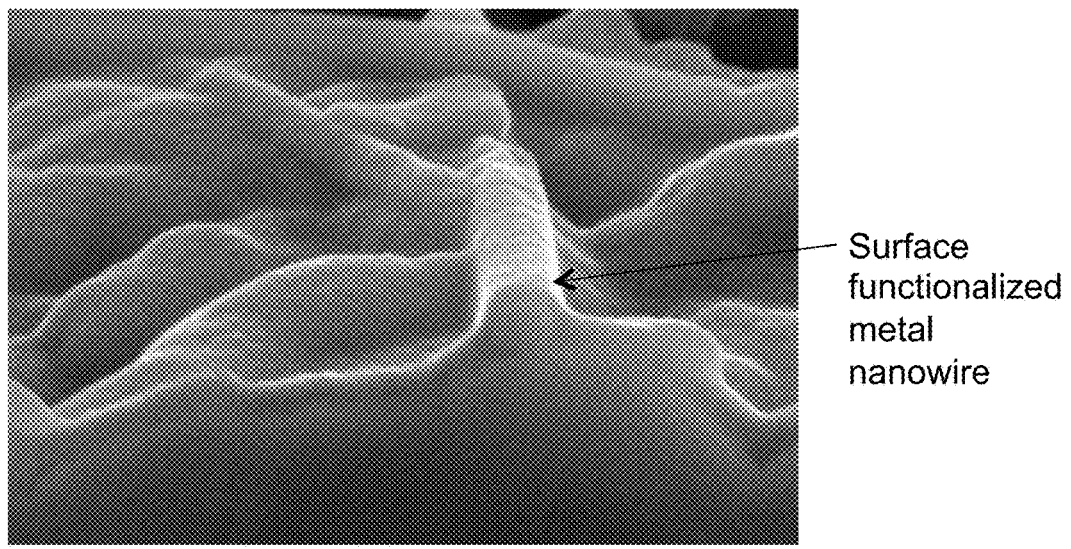
FIGS. 9a-b are cross sectional SEM images of a transparent conductive electrode comprising surface functionalized metal nanowires.
Figure 9B:
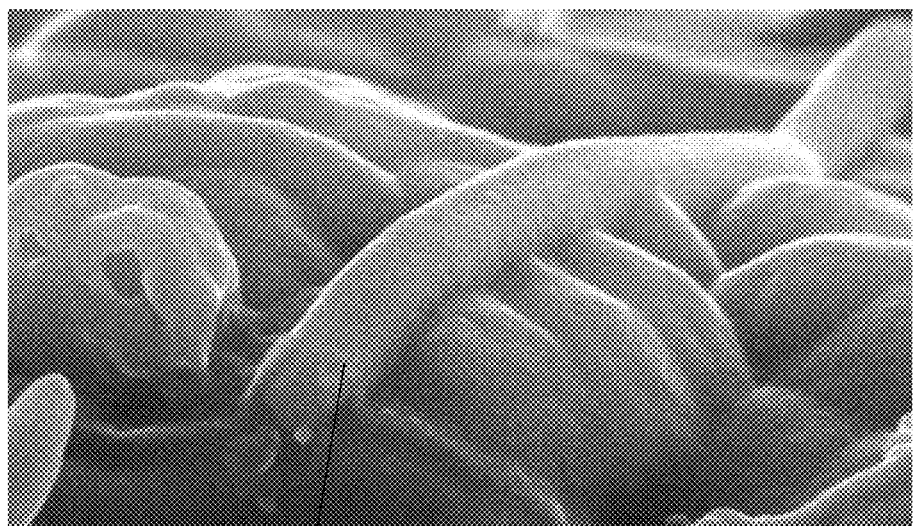

To provide further resolution into patterning, the present invention is directed to another method of manufacturing patterned nanowire based conductive film, wherein the patterned conductive film comprise conductive regions and non conductive regions, and the conductive regions comprise nanowires protected by surface functionalization means. Exemplar surface functionalization means are self-assembly monolayers on the metal nanowire. FIGS. 9a and 9b are cross sectional SEM images of the transparent conductive electrodes comprising surface functionalized metal nanowires.

Surface functionalized metal nanowires in the present invention, are referred to hybrid nanowires having a core shell or pseudo core shell structure. The surface functional groups includes any organic polymer functional groups or metal halides or oxide which can grown into a layer wrapping around the metal nanowire. Typically the metal nanowire is first synthesized by a polyol process disclosed in U.S. application Ser. No. 13/906,330, and purified by a multi-stage purification process, disclosed in U.S. application Ser. No. 13/906,330. Then the metal nanowire is converted to a metal/metal halide core shell structure by an acid or converted to a metal/metal oxide core shell structure by an oxidative agent.

In one embodiment, a method to prepare a metal/metal halide core shell nanowire is disclosed. The method comprises
synthesizing a metal nanowire;
purifying the metal nanowire;
suspending the purified metal nanowire in a solution; and
adding acid to the nanowire solution and mixing for a short period of time.

The method further comprises
diluting the nanowire solution with water after reacting with acid and transferring the diluted solution for purification immediately after the dilution.

In one example, the metal is silver and the acid is hydrogen chloride. It should be noted while hydrochloric acid is used in this example, other acids such as HBr, HI sulfuric acid and organic acids such as acetic acid, and formic acid. can also be used in place of HCl in the above example.

In another embodiment, a method to prepare a metal/metal oxide core shell nanowire is disclosed. The method comprises
synthesizing a metal nanowire;
purifying the metal nanowire;
suspending the purified metal nanowire in a solution; and
adding an oxidative agent to the nanowire solution and mixing for a short period of time.

The method further comprises
diluting the nanowire solution with water after reacting with acid and transferring the diluted solution for purification immediately after the dilution.

In one example, the metal is silver and the oxidative agent is hydrogen chloride. It should be noted although hydrogen peroxide is used as the oxidizing agent, other oxidative reagent such as potassium permanganate can also be used.

Further, the reactions converting silver nanowires to silver/silver chloride hybrid nanowires occurs at a temperature between 5-50 C.

Further, the nanowire solution has a concentration between 0.1%-5% (wt %).

Further, the reaction time is between 5-500 seconds.

In one embodiment of the present invention, it is directed to a material composition of the conductive film. The conductive film comprises a substrate; a substantially single layer on top of the substrate, wherein the single layer comprise surface functionalized metal nanowires and non-surface functionalized metal nanowires. The surface functionalized metal nanowires are chemically inert to the subsequent reaction with acid or other oxidation reagent. The non-surface functionalized metal nanowires are capable of undergoing chemical conversion when exposed to acid or other oxidative reagent.

The surface functionalized metal nanowires form a first region of the film. After the non-surface functionalized metal nanowires are converted to the corresponding oxidative state to form a second region of the film. The first region is a conductive region and second region is a less conductive or non-conductive region. In one example, the first region comprises silver metal. In another example, the second region comprises silver salt. In still another example, the second region comprises silver oxide. The first region contains conductive network with surface functionalized metal nanowires and non-surface functionalized metal nanowires. The second region comprises surface functionalized metal nanowires and converted silver salts and silver oxide.

The first region and second region of the present embodiment have substantially same optical properties. In another words the self assembly monolayers as surface functionalization means for the metal nanowires in the first region does not offer significant refractive index change. The patterned conductive film the difference in refractive index between the first and second region is less than 0.2, and the difference in haze is no more than 0.2%. In one example first region is silver, having a refractive index of 1.61. In another example, the second region is silver oxide, having a refractive index of 1.59.

The single layer in the patterned conductive film has surface functionalized nanowires and non-surface functionalized nanowires.

Figure 7A:
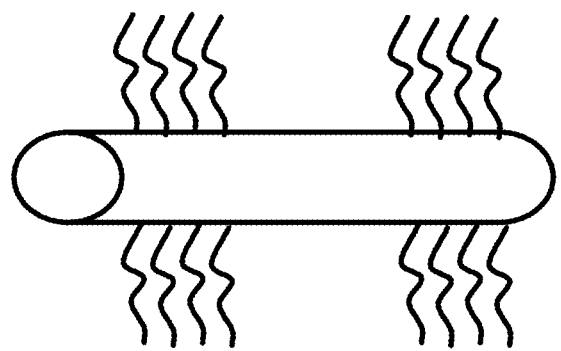
FIG. 7a is an illustration of an exemplary metal nanowire having self assembly monolayer for protecting metal nanowire from surface oxidization.
Figure 7B:
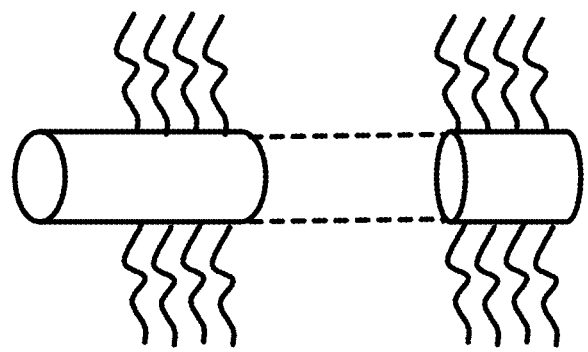
FIG. 7b is an illustration of an exemplary metal nanowire after acid or oxidant exposure.

In one example, the surface functionalized nanowire and non-surface functionalized nanowire are the different portions of the same nanowire, as shown in FIG. 7a. Upon oxidation or acid exposure, referring to FIG. 7b, the nanowire in FIG. 7a can first be oxidized and then be fragment into two parts, having the surface functionalized portions de-attached from each other. This reduces the original length of the nanowire, making the converted region less conductive. If the all the nanowires in the converted region is fragmented, the average length of the nanowires in the fragmented region is less than half of the original length, which is the same average length of the first region comprising nanowires which are self assembly monolayer protected.

In another example, the surface functionalized nanowire and non-surface functionalized nanowire are different nanowires, as shown in FIG. 8a. Upon oxidation or acid exposure, referring to FIG. 8b, the nanowire without the surface functionalization disintegrates, leaving the surface functionalized nanowires maintaining its length. The surface functionalized nanowire is a completely functionalized nanowire, synthesized, characterized and purified before use. A mixture of completely functionalized nanowire and non-surface functionalized metal nanowire in a controlled ratio is used to prepare the nanowire film in the patterned conductive film.

In still another example, the surface functionalized nanowire and non-surface functionalized nanowire are both different portions of the same nanowire as in FIG. 7a and different nanowires, as shown in FIG. 8a. Upon oxidation or acid exposure, some nanowires disintegrates, reducing in length but some keeping its original length. The mixture of the nanowire can be an average or statistical mixture of the functionalized nanowire and non-surface functionalized metal nanowires.

The present invention is directed to a method of manufacturing a patterned nanowire based conductive film. The film comprises a first region comprising functionalized metal nanowires and a second region comprising the oxidative state or salt of the same metal in the first region.

In one embodiment of the present invention, the method of patterning the conductive film comprises
providing a substrate,
forming a film comprising a first region having metal nanowires, wherein at least some of metal nanowires are surface functionalized and inert to oxidation or acid reactions;
evaporating away the solvent in the metal nanowire film;
exposing the nanowire film to a chemical reagent;
converting the metal in the metal nanowire network to its oxidative state and forming a second region,
wherein the first and second region have different electrical properties, but having substantially same or similar optical properties, with difference in refractive indexes are less than 0.2, and the difference in haze is no more than 0.2%.

In one embodiment of the present invention, the method of patterning the conductive film comprises
providing a substrate,
forming a film comprising a surface functionalized silver nanowire wherein some portion of the nanowire is surface functionalized and inert to oxidation or etching,
exposing the film to etchants or oxidants and reacting the nanowire with oxidants/acids,
disintegrating the unprotected non-surface functionalized nanowire into segments;
wherein the arrangement of surface functionalized portions and non-surface functionalized portions on a nanowire can be regularly or randomly pitched.

The randomly pitched non-surface functionalized area can occur as coverage defects or insufficient coverage of surface molecule assembly on nanowires.

Post Treatment of the Patterned Transparent Conductive Film

After the transparent conductive film is patterned into desired conductive regions and non conductive regions, the application of heat may also be used at this point as a post-treatment. Typically, the patterned transparent conductive film exposed to anywhere from 80° C. to 250° C. for up to 10 min., and more preferably is exposed to anywhere from 100° C. to 160° C. for anywhere from about 10 seconds to 2 minutes. The transparent conductive film can also be exposed to temperatures higher than 250° C. and can be even higher, depending on the type of substrate. For example, glass substrate can be heat-treated at a temperature range of about 350° C. to 400° C. However, post treatments at higher temperatures (e.g., higher than 250° C.) require the presence of a non-oxidative atmosphere, such as nitrogen.

In another examples, an infrared lamp could be used as either independently or together with the heating method to anneal the patterned transparent film. Again, the post anneal is recommended to perform in an inert atmosphere.

Other Functional Layers

The patterned conductive film can further comprise other functional layers, in order to meet end use applications. Other functional layers include an adhesive layer, anti-reflective layer, anti-glare layer, barrier layers, hard coats, and protective films. These other functional layers are employed sometimes to enhance the overall optical performance and improve the mechanical properties of the transparent conductive film. These additional layers, also referred to as "performance-enhancing layers", can be one or more anti-reflective layers, anti-glare layers, adhesive layers, barrier layers, and hard coats. In certain embodiments, one performance-enhancing layer provides multiple benefits. For example, an anti-reflective layer can also function as a hard coat and/or a barrier layer. In addition to their specific properties, the performance-enhancing layers are optically clear.

"Anti-reflective layer" refers to a layer that can reduce reflection loss at a reflective surface of the transparent conductive film. The anti-reflective layer can therefore be positioned on the outer surfaces of the transparent conductive film. Materials suitable as anti-reflective layers are well known in the art, including without limitation: fluoropolymers, fluoropolymer blends or copolymers, at about 100 nm thick or 200 nm in thickness.

"Anti-glare layer" refers to a layer that reduces unwanted reflection at an outer surface of the transparent conductive film by providing fine roughness on the surface to scatter the reflection. Suitable anti-glare materials are well known in the art, including without limitation, siloxanes, polystyrene/PMMA blend, lacquer (e.g., butyl acetate/nitrocellulose/wax/alkyd resin), polythiophenes, polypyrroles, polyurethane, nitrocellulose, and acrylates, all of which may comprise a light diffusing material such as colloidal or fumed silica. Blends and copolymers of these materials can have microscale compositional heterogeneities, which can also exhibit light diffusion behavior to reduce glare.

"Hard coat", or "anti-abrasion layer" refers to a coating that provides additional surface protection against scratches and abrasion. Examples of suitable hard coats include synthetic polymers such as polyacrylics, epoxy, polyurethanes, polysilanes, silicones, poly(silico-acrylic) and so on. Typically, the hard coat also comprises colloidal silica. The thickness of the hard coat is typically from about 1 to 50 μm.

"Adhesive layer" refers to any optically clear material that bonds two adjacent layers (e.g., conductive layer and substrate) together without affecting the physical, electrical or optical properties of either layer. Optically clear adhesive material are well known in the art, including without limitation: acrylic resins, chlorinated olefin resins, resins of vinyl chloride-vinyl acetate copolymer, maleic acid resins, chlorinated rubber resins, cyclorubber resins, polyamide resins, cumarone indene resins, resins of ethylene-vinyl acetate copolymer, polyester resins, urethane resins, styrene resins, polysiloxanes and the like.

"Barrier layer" refers to a layer that reduces or prevents gas or fluid permeation into the transparent conductive film. It has been shown that corroded metal nanowires can cause a significant decrease in the electrical conductivity as well as the light transmission of the conductive layer. The barrier layer can effectively inhibit atmospheric corrosive gas from entering the conductive layer and contacting the metal nanowires in the matrix. The barrier layers are well known in the art, including without limitation: see, e.g. U.S. Patent Application No. 2004/0253463, U.S. Pat. Nos. 5,560,998 and 4,927,689, EP Patent No. 132,565, and JP Patent No. 57,061,025. Moreover, any of the anti-reflective layer, anti-glare layer and the hard coat can also act as a barrier layer.

In certain embodiments, the patterned transparent conductive film may further comprise a protective film above the conductive layer (the layer comprise metal nanowires). The protective film is typically flexible and can be made of the same material as the flexible substrate. Examples of protective film include, but are not limited to: polyester, polyethylene terephthalate (PET), polybutylene terephthalate, polymethyl methacrylate (PMMA), acrylic resin, polycarbonate (PC), polystyrene, or the like; particularly preferable is PET, PC, PMMA, or TAC because of their high strength.

In Devices

The patterned transparent conductive films as described herein can be used as films in a wide variety of devices, including any device that currently makes use of transparent conductive films such as metal oxide films. Examples of suitable devices include flat panel displays, LCDs, touch screens, electromagnetic shieldings, functional glasses (e.g., for electrochromic windows), optoelectronic devices, and the like. In addition, the transparent conductive films herein can be used in flexible devices, such as flexible displays and touch screens.

Example 1 Synthesis of Silver Nanowires 51 g of PVP is first dissolved in 500 mL of glycerol solvent and heated to 150 C. In the meantime, 51 g of silver nitrate is dissolved in 300 ml of glycerol separately to form silver nitrate solution. Then, the silver nitrate solution is added to the PVP solution at a constant rate of 20 ml/min for 9 minutes; this is then followed by adding the remaining portion of silver nitrate solution at 4 ml/min for another 30 minutes. The reaction is allowed to proceed for another 3 hours before it is quenched by mixing equal volume of cold water (20 C). The reaction mixture was then solvent exchanged by repeated centrifuge and re-dispersion in desired solvents. Choices of solvent for the centrifuge/re-dispersion processes is determined by the desired dispersing medium for nanowire in ink formulation, e.g. water or ethanol. Typical amount of solvent used in re-dispersion is about 50× or more of the remaining solid collected by centrifuged. The whole process is repeated at least 3 times.

Example 2 Preparation of a Transparent Conductive Film

Silver nanowires (25 um, 60 nm) were first prepared by polyol process and followed by purification. Then 0.15 g of purified nanowires was dispersed in a 50 ml of binder free solvent such as ethanol or methanol or IPA to prepare a 0.3% w/v of silver nanowire dispersion.

On a PET substrate, a thin layer of SNW dispersion is spun coated at 1500 rpm spin speed for 30 s. The coated substrate was baked at 100 C for 1 minute. A layer of 1.8% wt silica sol-gel solution was applied on top of baked sample by spin coating at 2500 rpm for 10 s. The resulted sample was further baked at 100 C for 1 minute.

The final sample comprises a PET substrate with a connected silver nanowire network buried or embedded in closely packed silica particles.

Examples of Patterning of Conductive Layers by Inkjet Printing

Figure 10:
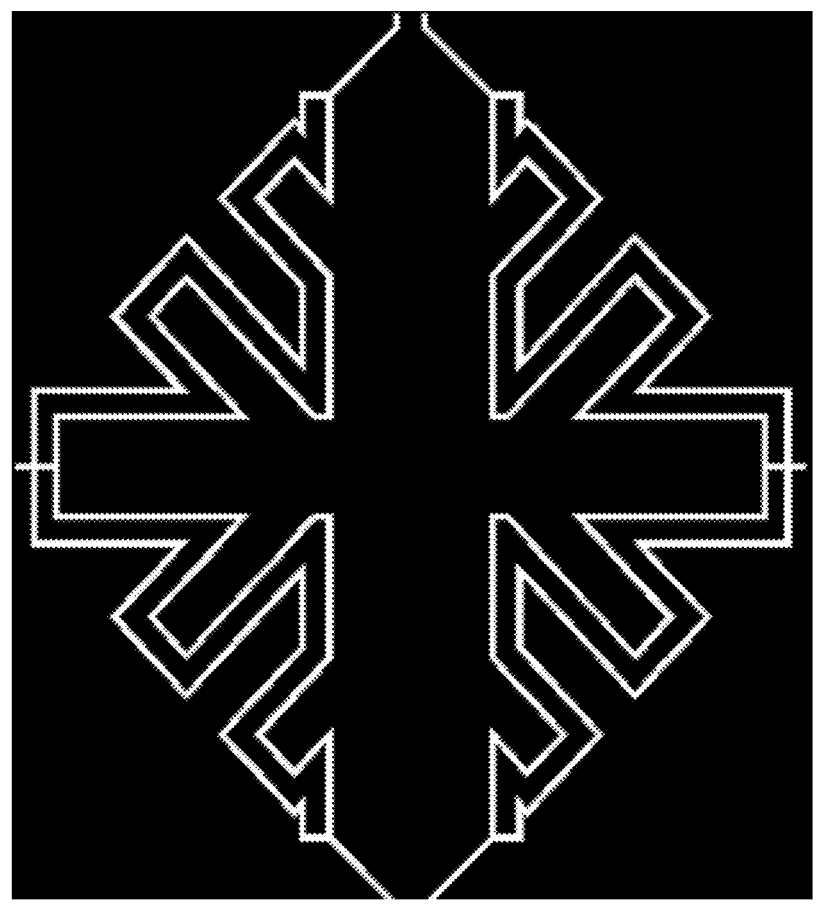
FIG. 10 illustrates an exemplary patterns for inject printing, wherein the white lines represent where the printing lines of the etchant.

Prepare etching solution and place the solution into ink containers of the inkjet printing cartridges. Adjust the inkjet printer to appropriate values, select a desired pattern to be printed and lay different patterns on top of each other if necessary to achieve accurate patterns. FIG. 10 illustrates an exemplary patterns, wherein the white lines represent where the printing lines of the etchant. Appropriate heat is applied when necessary.

Figure 11:
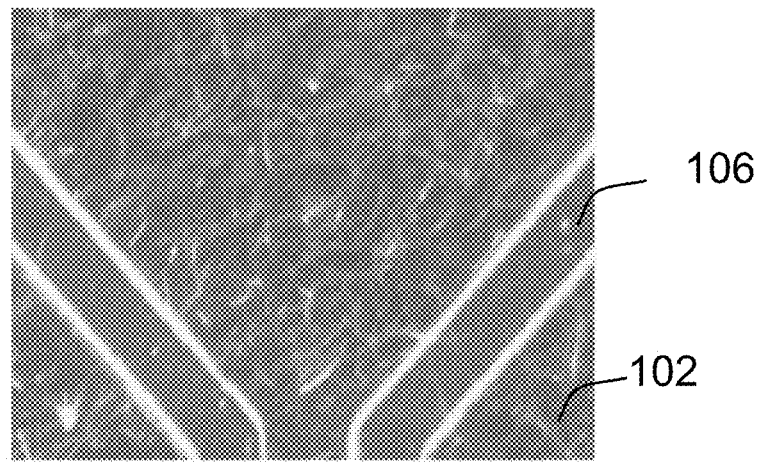
FIG. 11 shows an SEM image of a comparative example, wherein the second regions were all etched away.
Figure 12:
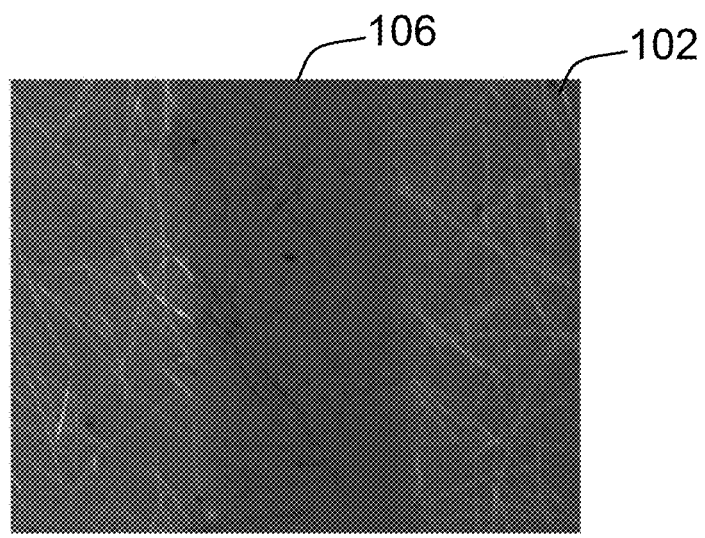
FIG. 12 shows an SEM image wherein the second region is oxidized instead of all etched way.

FIG. 11 shows a SEM image where the second regions were all etched away. FIG. 12 shows a SEM image wherein the second region is oxidized instead of all etched way. Comparing FIG. 12 with FIG. 11, FIG. 12 shows clearly that patterned film is more optically uniform.

Figure 13A:
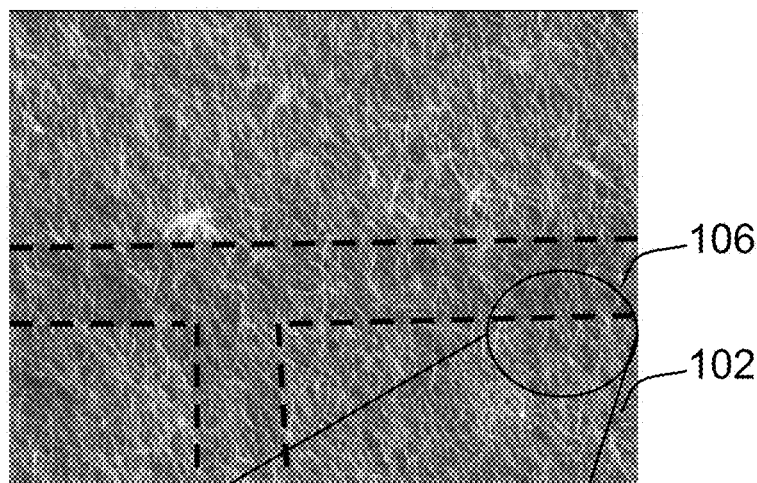
FIG. 13a is an SEM image showing the conductive film comprising surface functionalize metal nanowires after being patterned.
Figure 13B:
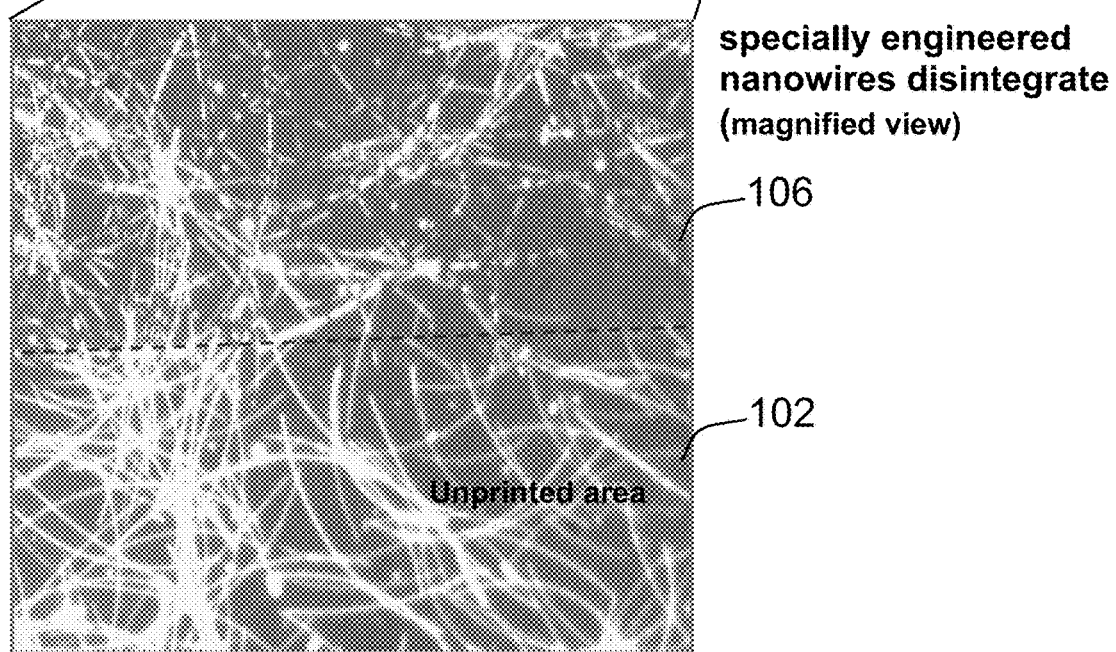

FIG. 13a is an SEM image showing the conductive film comprising surface functionalize metal nanowires after being patterned, wherein the area 102 is the first area, not being etched, and area 106 is the second area, being etched. The first area 102 is the conductive area and the second area 106 is the non-conductive area. FIG. 13b is a zoom in image of part of FIG. 13a. FIG. 13b demonstrated that the non-conductive regions comprise shorter metal nanowires, or less metal nanowires, or more isolated nanowire clusters.

Examples of preparing the electrode having surface functionalized metal nanowires Example 1—To form a Silver/Silver Chloride Core Shell Nanowire
1. Silver nanowires were synthesized by a polyol process;
2. Silver nanowires were then purified by multi-stage purification;
3. To the purified 100 ml of nanowire solution, about 1 ml of concentrated hydrochloric acid was added and mixed well for 60 seconds. Then it is followed by dilution of additional 900 mL of $H_2O$ and was immediately transferred for further purification;
4. Additional purification step was carried out to exchange the acidic solution with water by multiple settling, washing and decanting;
5. The nanowires collected had a surface functionalized core-shell structure with silver core and silver halide protective shell.

Example 2—Method to Form Oxide Shell on Silver Nanowires
1. Silver nanowires were synthesized by a polyol process;
2. Silver nanowires was then purified by multi-stage purification;
3. To the purified 100 mL of nanowire solution, about 3 mL of 10% hydrogen peroxide solution was added and mixed well for 30 seconds. Then it is followed by dilution of additional 900 mL of $H_2O$ and was immediately transferred for further purification;
4. Additional purification step is carried out to exchange the acidic solution with water by multiple settling, washing and decanting;
5. The nanowires collected had a surface functionalized core-shell structure with silver core and silver oxide protective shell.

It will be appreciated by those skilled in the art that the above discussion is for demonstration purpose; and the examples discussed above are some of many possible examples. Other variations are also applicable. Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby. Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes, which come within the meaning and range of equivalency of the claims, are intended to be embraced therein. As used in this disclosure, the term "preferably" is non-exclusive and means "preferably, but not limited to" Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

The invention claimed is:
1. A patterned transparent conductive film, comprising
   a substrate;
   a substantial single layer on top of the substrate, comprising
      a first region comprising a network of metal nanowires which are surface functionalized and inert to oxidation or acid reactions; and
      a second region, comprising a plurality of metal nanowires which are surface functionalized and inert to oxidation or acid reactions, and optionally metal oxide nanowires, wherein the metal nanowires in the second region do not form a network.

2. The film of claim 1, wherein the metal nanowire is silver nanowire.

3. The film of claim 2, wherein the metal nanowire of the first region has a diameter of 50 nm or less.

4. The film of claim 1, wherein the refractive index difference between the first region and the second region is less than 0.05.

5. The film of claim 1, wherein the haze difference between the first region and the second region is less than 0.2%.

6. The film of claim 1, wherein the first region has a dimension parallel to a plane formed by the layer on top of the substrate that is larger than 1 um.

7. The film of claim 1, wherein the first region has a dimension parallel to a plane formed by the layer on top of the substrate that is larger than 10 um.

8. The film of claim 1, wherein the second region has a dimension parallel to a plane formed by the layer on top of the substrate that is less than 200 um.

9. The film of claim 1, wherein the second region has a dimension parallel to a plane formed by the layer on top of the substrate that is less than 100 um.

10. The film of claim 1, wherein the single layer has a thickness between 50-150 nm.

11. The film of claim 1, wherein the average length of the nanowires between the first and second region is more than 2:1.

* * * * *